(12) United States Patent
Rösner et al.

(10) Patent No.: US 6,362,502 B1
(45) Date of Patent: Mar. 26, 2002

(54) DRAM CELL CIRCUIT

(75) Inventors: Wolfgang Rösner; Thomas Schulz, both of München; Lothar Risch, Neubiberg; Franz Hofmann, München, all of (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/692,118

(22) Filed: Oct. 19, 2000

(30) Foreign Application Priority Data

Oct. 19, 1999 (DE) ......................................... 199 50 362

(51) Int. Cl.$^7$ ........................................... H01L 27/108

(52) U.S. Cl. .................. 257/298; 257/315; 365/185.08; 365/149

(58) Field of Search ................................ 257/298, 315; 365/149, 185.08

(56) References Cited

U.S. PATENT DOCUMENTS

| | | | |
|---|---|---|---|
| 5,063,425 A | * 11/1991 | Yamauchi et al. | .......... 257/298 |
| 5,220,530 A | 6/1993 | Itoh | |
| 5,357,464 A | * 10/1994 | Shukuri et al. | ........ 365/185.18 |
| 5,557,566 A | * 9/1996 | Ochii | .................... 365/185.08 |
| 5,712,817 A | * 1/1998 | Suh | ........................ 365/185.08 |

OTHER PUBLICATIONS

Hsing–Jen Wann et al.: "A Capacitorless DRAM Cell on SOI Substrate", IEDM 1993, pp. 635–638.
Shoji Shukuri et al: "A Semi–Static Complementary Gain cell Technology For Sub–1 V Supply DRAM's", IEEE Transactions on Electron Devices, vol. 41, No. 6, Jun. 1994, pp. 926–930.
Mehrdad Heshami et al.: "A 250–MHz Skewed–Clock Pipelined Data Buffer", IEEE Journal of Solid–State Circuits, vol. 31, No. 3, Mar. 1996, pp. 376–383.

* cited by examiner

*Primary Examiner*—Hoai V. Ho
(74) *Attorney, Agent, or Firm*—Herbert L. Lerner; Laurence A. Greenberg; Werner H. Stemer

(57) ABSTRACT

A memory cell contains a memory transistor and a transfer transistor. A gate electrode of the transfer transistor and a control gate electrode of the memory transistor are connected to a word line. The memory transistor has a floating gate electrode that is isolated from a channel region of the memory transistor by a first dielectric layer and is connected to a first source/drain region of the transfer transistor. The control gate electrode is isolated from the floating gate electrode by a second dielectric layer. A first source/drain region of the memory transistor is connected to a bit line. The memory and transfer transistors are preferably of different conductivity types. During the writing of information, the transfer transistor is in the on-state and the memory transistor is in the off-state. During the reading-out of information, the transfer transistor is in the off-state and the memory transistor is in the on-state.

7 Claims, 2 Drawing Sheets

DRAM CELL CIRCUIT

BACKGROUND OF THE INVENTION

FIELD OF THE INVENTION

The invention relates to a DRAM cell circuit, that is to say a dynamic random access memory cell circuit.

At the present time, a so-called one-transistor memory cell is usually used as the memory cell of the DRAM cell circuit. Such a memory cell contains a transistor and a capacitor on which the information is stored in the form of a charge. By driving the transistor via a word line, the charge on the capacitor can be read out via a bit line. Since the charge of the capacitor drives the bit line and a signal generated by the charge should remain identifiable despite background noise, the capacitor must have a minimum capacitance. In order to attain the highest possible packing density of the DRAM cell circuit, capacitors are proposed which have surfaces of a complicated configuration or which have capacitor dielectrics made of special materials having high dielectric constants.

An alternative DRAM cell circuit avoids the high process outlay for producing capacitors with a small space requirement and a large capacitance. The reference by M. Heshami et al. "250-MHz Skewed-Clock Pipelined Date Buffer", IEEE Journal of Solid-State Circuits, Vol. 31, No. 3, March 1996, 376, describes a DRAM cell circuit in which a memory cell is a dynamic gain memory cell which contains a first selection transistor, a memory transistor and a second selection transistor. The first selection transistor is connected between a first bit line and a gate electrode of the memory transistor. A gate electrode of the first selection transistor is connected to a first word line. The second selection transistor is connected between a source/drain region of the memory transistor and a second bit line. A gate electrode of the second selection transistor is connected to a second word line. A further source/drain region of the memory transistor is connected to a voltage terminal. As in the case of the one-transistor memory cell, the information is stored in the form of an electric charge. However, the electric charge does not have to drive the bit line directly, but rather is stored on the gate electrode of the memory transistor and serves only for controlling the latter, for which purpose even a very small quantity of electric charge is sufficient. In order to write an item of information to the gate electrode of the memory transistor, the first selection transistor is driven via the first word line, with the result that there is established at the gate electrode of the memory transistor a voltage which is dependent on a voltage on the first bit line, the magnitude of which in turn depends on the information to be written. In order to read out the information, the second selection transistor is driven via the second word line. Depending on the information, that is to say depending on the voltage on the gate electrode of the memory transistor, the memory transistor is in the on state or in the off state, and a current does or does not flow between the voltage terminal and the second bit line.

An EPROM is a nonvolatile memory cell circuit in which, in contrast to the DRAM cell circuit, the information does not have to be continuously refreshed again. The information is stored in the form of at least two different threshold voltages of transistors. In order to read out an item of information of one of the transistors, a voltage lying between the two threshold voltages is applied to a control gate electrode of the transistor. Depending on whether or not a current flows through the transistor, the logic value zero or one is read out. The threshold voltage of the transistor can be set by a floating gate electrode that is electrically insulated and disposed between the control gate electrode and a channel region of the transistor. To that end, a voltage drop is produced between the control gate electrode and the channel region or a source/drain region of the transistor, which causes electrons to tunnel into the or from the floating gate electrode. Different charges of the floating gate electrode lead to different threshold voltages of the transistor. Since the floating gate electrode is completely insulated, there are no leakage currents and the information does not have to be refreshed again.

The literature reference IEEE Transactions on Electron Devices, Volume 41, No. 6, June 1994, pages 926 to 930 describes a DRAM cell circuit having a p-channel writing transistor and an n-channel reading transistor which has a floating gate. The control gate electrodes of both transistors are connected to a word line. One of the source/drain terminals of the reading transistor is at a supply potential, and the other of its source/drain terminals is connected to a bit line. One of the source/drain terminals of the writing transistor is connected to the floating gate of the reading transistor, and the other is connected to the bit line.

U.S. Pat. No. 5,220,530 teaches a memory cell having an access transistor, whose gate electrode is connected to a word line, and a further transistor with a floating gate. One of the source/drain terminals of the access transistor is connected to a bit line, and the other source/drain terminal is connected to the control gate electrode of the further transistor. One of the source/drain terminals of the further transistor is connected to the bit line, and the other is connected to a supply potential.

SUMMARY OF THE INVENTION

It is accordingly an object of the invention to provide a DRAM cell circuit and a method for fabricating it that overcomes the above-mentioned disadvantages of the prior art methods and devices of this general type, which can be fabricated with a low process outlay in conjunction with a high packing density. Furthermore, the intention is to specify a method for operating the DRAM cell circuit and a method for producing the DRAM cell circuit.

With the foregoing and other objects in view there is provided, in accordance with the invention, a dynamic random access memory (DRAM) cell circuit, which includes a voltage terminal, a word line, a bit line running transversely to the word line, and a plurality of memory cells. Each of the memory cells contains a memory transistor having a channel region, a control gate electrode, a floating gate electrode, a first source/drain region, and a second source drain region. A transfer transistor having a gate electrode, a first source/drain region and a second source/drain region is also part of each of the memory cells. The word line is connected to the gate electrode of the transfer transistor. A first dielectric layer is disposed between and isolates the floating gate electrode of the memory transistor from the channel region of the memory transistor, and the floating gate electrode is connected to the first source/drain region of the transfer transistor. A second dielectric layer is disposed between and isolates the control gate electrode of the memory transistor from the floating gate electrode of the memory transistor, and the control gate electrode is connected to the word line. The first source/drain region of the memory transistor is connected to the bit line, and the second source/drain region of the memory transistor and the second source/drain region of the transfer transistor are connected to the voltage terminal.

The problem is solved by a DRAM cell circuit having a plurality of memory cells, in which the memory cells each have a memory transistor and a transfer transistor. The gate electrode of the transfer transistor is connected to the word line. The memory transistor has a floating gate electrode that is isolated from the channel region of the memory transistor by the first dielectric layer and is connected to the first source/drain region of the transfer transistor. The memory transistor has a control gate electrode, which is isolated from the floating gate electrode by the second dielectric layer and is connected to the word line. The first source/drain region of the memory transistor is connected to the bit line, which runs transversely with respect to the word line. The second source/drain region of the memory transistor and the second source/drain region of the transfer transistor are connected to the voltage terminal.

A method for operating such a DRAM cell circuit is specified below, which method likewise solves the problem relating to reading and writing information.

In order to write information to the memory cell, the word line has applied to it a write voltage such that the transfer transistor is in the on state. Furthermore, during the writing of the information, the bit line has applied to it a bit line voltage which is dependent on the information to be stored, with the result that the floating gate electrode is charged with a charge which is dependent on the bit line voltage. The information is thus stored in the form of a charge on the floating gate electrode.

In order to read out the information of the memory cell, the word line has applied to it a read voltage such that a signal is generated on the bit line in a manner dependent on the charge on the floating gate electrode.

If either the logic one or the logic zero is intended to be stored on the memory cell, then the bit line voltage may, depending on the information to be stored, be such that the memory transistor is in the on state in the event of the logic one being read out, and is in the off state in the event of a logic zero being read out, or vice versa. If the memory transistor is in the on state, then a voltage change and/or a current change can be measured on the bit line. If the memory transistor is in the off state, the voltage and current of the bit line do not change. In this case, the signal on the bit line consists in the fact that nothing happens.

As an alternative, the memory transistor may be in the on state to varying degrees depending on the charge on the floating gate electrode, that is to say depending on the stored information.

The bit line voltage determines the charge on the floating gate electrode and the latter in turn determines the threshold voltage of the memory transistor. Different threshold voltages lead to different signals on the bit line during the read-out. If the threshold voltage is not exceeded by the read voltage, then the memory transistor is in the off state.

Between the writing and the reading-out of the information, the word line has applied to it a quiescent voltage such that the memory transistor and the transfer transistor are in the off state.

Since the memory cell does not have a capacitor, it is particularly simple to produce the memory cell with a small space requirement, with the result that the DRAM cell circuit has a particularly high packing density. An increased process outlay is not necessary since it is possible to dispense with complicated surfaces and special materials having high dielectric constants.

The memory cell may have just two transistors, for example, with the result that the packing density of the DRAM cell circuit according to the invention can be increased more simply than in the case of a DRAM cell circuit in which a memory cell contains three transistors.

The floating gate electrode does not really float, since the transfer transistor may have leakage currents, with the result that the charge on the floating gate electrode can vary over the course of time. As a rule, it is necessary to refresh the stored information.

Since, during writing, all the transfer transistors connected to the word line to which the write voltage is applied are in the on state, it is advantageous if the associated memory cells are programmed at the same time.

The write voltage is preferably such that the memory transistor is in the off state during writing. In this case, during writing, no current flows through the memory transistor and the power consumption is consequently lower. If the memory transistor and the transfer transistor are of the same conductivity type, then in this case the threshold voltage of the memory transistor is higher than that of the transfer transistor. The write voltage lies between the threshold voltage of the memory transistor and the threshold voltage of the transfer transistor.

The read voltage is preferably such that the transfer transistor is in the off state during read-out. The charge on the floating gate electrode thus remains essentially constant during read-out. Therefore, the signals on the bit line are more pronounced and e.g. the signal of the logic one differs more greatly from the signal of the logic zero. Since the information is lost less rapidly, the information has to be refreshed less often. If the memory transistor and the transfer transistor are of the same conductivity type, then in this case the threshold voltage of the transfer transistor is higher than the threshold voltage of the memory transistor. In this case, the read voltage lies between the threshold voltage of the transfer transistor and the threshold voltage of the memory transistor.

In order to obtain both a lower power consumption and more pronounced signals on the bit line and longer refresh times, it is advantageous if the memory transistor is of a conductivity type which is opposite a conductivity type of the transfer transistor. In this case, the write voltage can be chosen in such a way that the memory transistor is in the off state and the transfer transistor is in the on state. The read voltage can be chosen in such a way that the transfer transistor is in the off state and the memory transistor is in the on state.

By way of example, the transfer transistor is an n-channel transistor while the memory transistor is a p-channel transistor. As an alternative, the transfer transistor is a p-channel transistor and the memory transistor is an n-channel transistor.

If the transfer transistor is an n-channel transistor and the memory transistor is a p-channel transistor, then the write voltage is equal to a positive operating voltage, for example, and the read voltage is equal to zero volts, for example. The quiescent voltage is greater than zero volts and less than the operating voltage.

If the transfer transistor is a p-channel transistor and the memory transistor is an n-channel transistor, then the write voltage is equal to zero volts, for example, and the read voltage is equal to a positive operating voltage, for example. The quiescent voltage is greater than zero volts and less than the operating voltage.

The bit line voltage is dependent on the information to be stored and is equal to the operating voltage or equal to zero volts. By way of example, the bit line voltage is equal to the operating voltage if the logic one is intended to be stored, and equal to zero volts if the logic zero is intended to be stored.

In order to increase the packing density, it is advantageous if the second source/drain region of the memory transistor and the second source/drain region of the transfer transistor are connected to the same voltage terminal. As an alternative, the second source/drain region of the memory transistor is connected to a different voltage terminal than the second source/drain region of the transfer transistor.

The voltage terminal is kept at a constant potential.

If the transfer transistor is a p-channel transistor and the memory transistor is an n-channel transistor, then the voltage terminal is kept for example at a voltage lying between zero volts and the operating voltage.

A particularly high packing density is obtained if the transfer transistor is configured as a thin-film transistor. In this case, the source/drain regions and the channel region of the transfer transistor are composed of polysilicon and can be produced within a thin layer. The transfer transistor can be disposed as a thin-film transistor on parts of the memory transistor, which is disposed in the substrate, thereby producing a particularly high packing density.

In order to increase the packing density, it is advantageous if the control gate electrode corresponds to the gate electrode of the transfer transistor.

In order to increase the packing density, it is advantageous if the floating gate electrode corresponds to the first source/drain region of the transfer transistor.

By way of example, the first source/drain region, the channel region and the second source/drain region of the memory transistor are disposed next to one another in the substrate in a manner adjoining a surface of the substrate. An insulating layer is disposed on the substrate. The insulating layer has a depression, which reaches down to the channel region of the memory transistor. The first dielectric covers at least a bottom of the depression. A layer made of polysilicon is disposed on the insulating layer and covers sidewalls of the depression and the first dielectric at the bottom of the depression without filling the depression. The first source/drain region of the transfer transistor is a part of the layer made of polysilicon that is disposed on the first dielectric at the bottom of the depression. The second source/drain region of the transfer transistor is a part of the layer made of polysilicon that is disposed on the insulating layer. The channel region of the transfer transistor is a part of the layer made of polysilicon that is disposed on the sidewalls of the depression. The second dielectric is disposed on the layer made of polysilicon. The control gate electrode is disposed on the second dielectric. The transfer transistor is configured as a vertical thin-film transistor.

Such a DRAM cell circuit can be produced for example as now described. In the substrate, the first source/drain region, the channel region and the second source/drain region of the memory transistor are produced next to one another in a manner adjoining the surface of the substrate. The insulating layer is produced on the substrate, in which layer the depression is produced which reaches down to the channel region of the memory transistor. The first dielectric is produced at least on the bottom of the depression. The layer made of polysilicon is deposited in a manner doped in situ by a first conductivity type, with the result that the layer is disposed on the insulating layer, the sidewalls of the depression and the first dielectric at the bottom of the depression. The thickness of the layer made of polysilicon is such that the depression is not filled by the layer. Afterwards, an implantation essentially perpendicular to the surface of the substrate is doped with ions of a second conductivity type, opposite to the first conductivity type, with the result that the first source/drain region of the transfer transistor is produced from the layer made of polysilicon, which source/drain region is doped by the second conductivity type and is disposed on the first dielectric at the bottom of the depression. The second source/drain region of the transfer transistor is produced from the layer made of polysilicon, which source/drain region is doped by the second conductivity type and is disposed on the insulating layer. The channel region of the transfer transistor is produced from the layer made of polysilicon, which channel region is doped by the first conductivity type and is arranged on the sidewalls of the depression. Afterwards, the second dielectric is produced on the layer made of polysilicon and the control gate electrode of the memory transistor is produced over the second dielectric.

The first dielectric may be produced prior to the production of the insulating layer on the substrate. As an alternative, the first dielectric may be produced after the production of the depression. If the first dielectric is produced by the deposition of insulating material in this case, the first dielectric covers not only the bottom of the depression but also the sidewalls of the depression.

The memory transistor is driven particularly well if a length of its channel region is approximately equal to a length of the floating gate electrode at the bottom of the depression, or a length of the control gate electrode at the bottom of the depression. Since the floating gate electrode is a part of the layer made of polysilicon which does not adjoin the sidewalls of the depression, it is consequently advantageous if the depression is longer than the channel region of the memory transistor by approximately twice the thickness of the layer made of polysilicon.

In order to produce the depression in a self-aligned manner with regard to the channel region of the memory transistor, it is advantageous to produce a mask on the surface of the substrate, which mask covers at least the channel region of the memory transistor. An implantation is carried out with the aid of the mask, thereby producing the first source/drain region and the second source/drain region of the memory transistor. In this case, the mask prevents the channel region of the memory transistor from being implanted.

Afterwards, spacers are formed in a manner adjoining the mask. In order to produce the insulating layer, insulating material is deposited and removed until the mask and the spacers are uncovered. The depression is produced by removing the mask and the spacers. The length of the depression is consequently equal to the sum of the length of the mask and twice the thickness of the spacers. The thickness of the layer made of polysilicon is preferably approximately equal to the thickness of the spacers.

A particularly high packing density can be obtained if a contact to the voltage terminal at the same time makes contact with the second source/drain region of the memory transistor and the second source/drain region of the transfer transistor. To that end, at least a part of a contact hole that reaches down to the second source/drain region of the memory transistor is disposed in the insulating layer. A contact fills the contact hole in such a way that it overlaps the second source/drain region of the transfer transistor.

An intermediate oxide may be disposed over the control gate electrode. The contact hole can cut through the intermediate oxide and reach partly down to the second source/ drain region of the transfer transistor and partly down to the second source/drain region of the memory transistor. In order to produce such a contact, first the layer made of polysilicon is patterned in such a way that it has, on the insulating layer, an extent which suitable for the contact-making of the second source/drain region of the transfer transistor. The intermediate oxide is applied after the production of the control gate electrode. By masked etching of the intermediate oxide and of the insulating layer selectively with respect to the layer made of polysilicon, a contact hole is produced in such a way that a part of the contact hole reaches down to the second source/drain region of the memory transistor and a further part of the contact hole reaches down to the layer made of polysilicon. Afterwards, the contact hole is filled with a contact.

In the case of an n-channel transistor, the source/drain regions thereof are n-doped. The channel region of the n-channel transistor may be p-doped, undoped or weakly n-doped. In the case of a p-channel transistor, the source/drain regions thereof are p-doped. The channel region of the p-channel transistor may be n-doped, undoped or weakly p-doped.

Other features which are considered as characteristic for the invention are set forth in the appended claims.

Although the invention is illustrated and described herein as embodied in a DRAM cell circuit and a method for fabricating it, it is nevertheless not intended to be limited to the details shown, since various modifications and structural changes may be made therein without departing from the spirit the invention and within the scope and range of equivalents the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
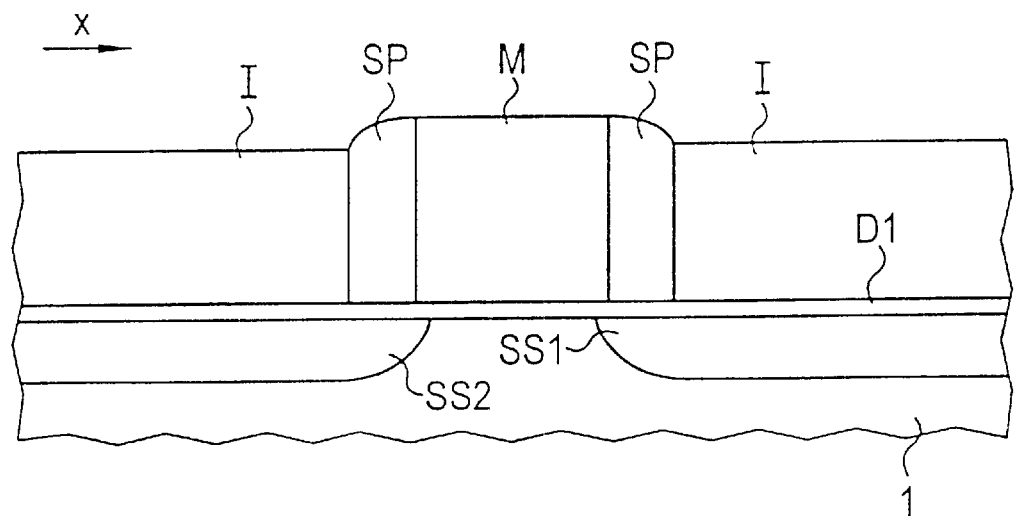
FIG. 1 is a diagrammatic, cross-sectional view through a substrate after a first source/drain region, a channel region and a second source/drain region of a memory transistor, a first dielectric, a mask, spacers and an insulating layer have been produced according to the invention.

In all the figures of the drawing, sub-features and integral parts that correspond to one another bear the same reference symbol in each case. It is noted that the figures of the drawing are not true to scale. Referring now to the figures of the drawing in detail and first, particularly, to FIG. 1 thereof, there is shown an exemplary embodiment having a substrate 1 made of p-doped silicon and is provided as a starting material. By producing trenches and filling them with an insulating material, insulating structures (not illustrated) are produced which isolate from one another mutually adjacent memory cells that are to be produced.

A first dielectric D1 having a thickness of approximately 5 nm is produced by thermal oxidation (see FIG. 1).

In order to produce a mask M, silicon nitride is deposited to a thickness of approximately 300 nm and is patterned by masked etching. For each memory cell, the mask M covers a strip-shaped region that has dimensions of 300 nm and 500 nm and runs perpendicularly to an x-axis x.

The mask M overlaps the insulating structures and divides regions of the memory cells to be produced, the regions being surrounded by the insulating structures, into two halves in each case.

In order to produce first source/drain regions SS1 and second source/drain regions SS2 of memory transistors S, an implantation with arsenic is carried out. Parts of the substrate 1 which are disposed under the mask M are suitable as channel regions C of the memory transistors S and are disposed between the first source/drain regions SS1 and the second source/drain regions SS2 of the memory transistors S (see FIG. 1).

In order to produce spacers SP, silicon nitride is deposited to a thickness of approximately 100 nm and etched back until the first dielectric D1 is uncovered (see FIG. 1).

In order to produce an insulating layer I, $SiO_2$ is deposited to a thickness of approximately 300 nm and planarized by chemical mechanical polishing until the mask M is uncovered (see FIG. 1). The insulating layer I is subsequently etched back selectively with respect to the silicon nitride to a width of approximately 100 nm, so that the spacers SP are partly uncovered.

Figure 2:
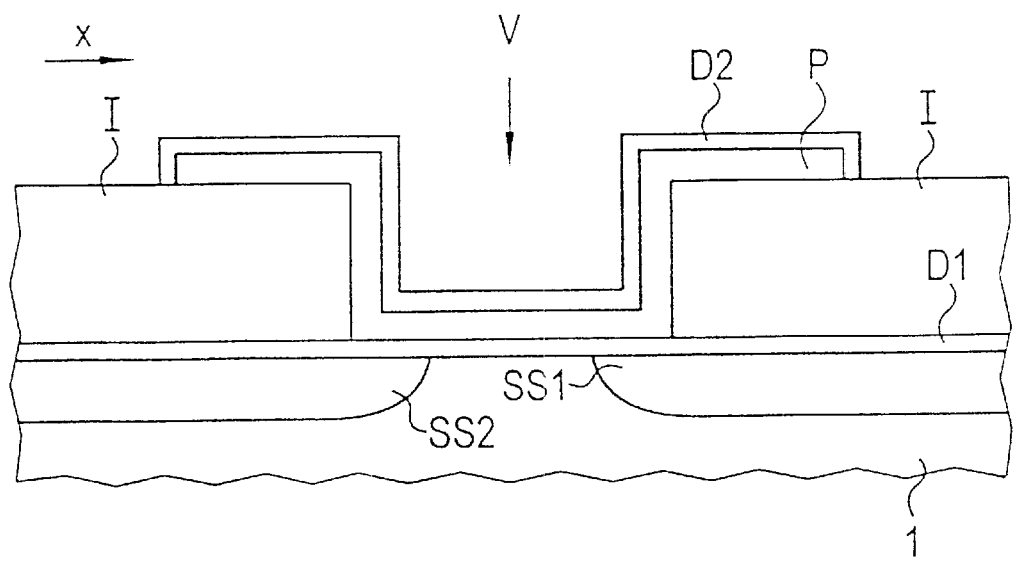
FIG. 2 is a cross-sectional view according to FIG. 1 after a depression, a layer made of polysilicon and a second dielectric have been produced.

In order to produce one depression V per memory cell (FIG. 2), the silicon nitride is subjected to wet-etching using hot phosphoric acid, for example, selectively with respect to $SiO_2$, so that parts of the first dielectric D1 are uncovered. The depressions V reach down to the channel regions C of the memory transistors S. The parts of the first dielectric D1 are disposed at the bottoms of the depressions V.

A layer made of in situ n-doped polysilicon P and having a thickness of approximately 50 nm is subsequently deposited. The layer made of polysilicon P is patterned with the aid of a non-illustrated mask made of photoresist, which mask covers rectangular regions in each of which one of the depressions V is disposed. The rectangular regions each have a side length parallel to the x-axis x of approximately 800 nm, and a dimension perpendicular to the x-axis x of approximately 900 nm. Mutually separate parts of the layer made of polysilicon P are produced (see FIG. 2).

A second dielectric D2 having a thickness of approximately 8 nm is produced on the layer made of polysilicon P by thermal oxidation.

Figure 3:
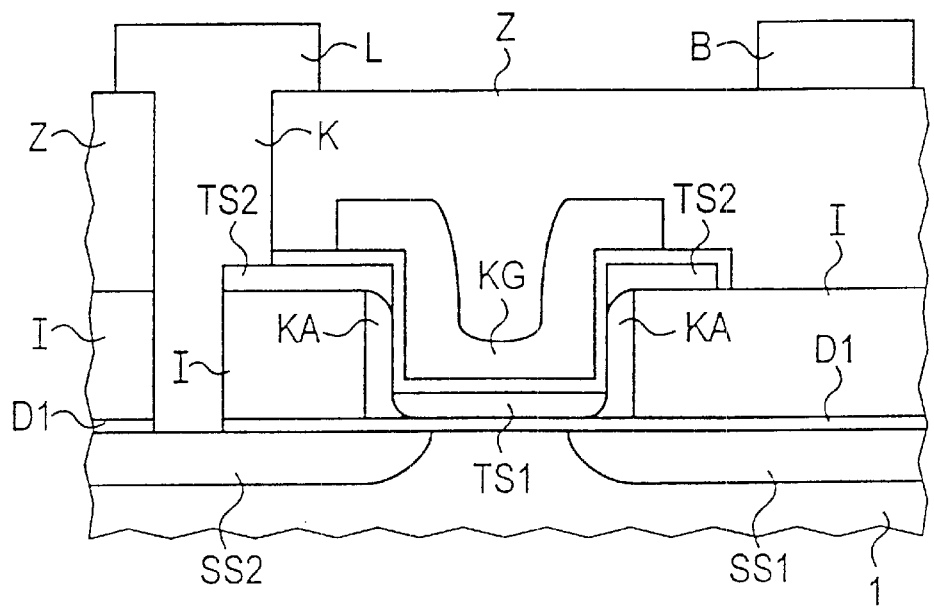
FIG. 3 is a cross-sectional view according to FIG. 2 after a first source/drain region, a channel region and a second source/drain region of a transfer transistor, a control gate electrode of the memory transistor, an intermediate oxide and a contact have been produced.

By performing a perpendicular implantation with boron ions, the layer made of polysilicon P is doped in such a way that first source/drain regions TS1 (FIG. 3) of transfer transistors T are produced from parts of the layer made of polysilicon P which are disposed at bottoms of the depressions V, second source/drain regions TS2 of the transfer transistors T are produced from parts of the layer made of polysilicon P which are disposed on the insulating layer I, and channel regions KA of the transfer transistors T are produced from parts of the layer made of polysilicon P which are disposed on sidewalls of the depressions V. One extent of the second source/drain region TS2 of the transfer transistor T of the memory cell, which extent is parallel to the x-axis and runs above the second source/drain region SS2 of the memory transistor S of the memory cell, amounts to approximately 250 nm. A further extent of the second source/drain region TS2 of the transfer transistor T, which extent is parallel to the x-axis and runs above the first source/drain region SS1 of the memory transistor S, amounts to approximately 150 nm. Extents of the second source/drain region TS2 of the transfer transistor T that are perpendicular to the x-axis amount to approximately 900 nm. The second source/drain region TS2 of the transfer transistor T surrounds the depression V of the memory cell.

The first source/drain regions TS1 of the transfer transistors T simultaneously act as floating gate electrodes of the memory transistors S.

Afterwards, in situ n-doped polysilicon is deposited to a thickness of approximately 150 nm and patterned in strip form by a photolithographic method. Word lines W are thus produced that run perpendicularly to the x-axis, have a width of approximately 600 nm and cover the depressions V. The word lines W are disposed on the second dielectric D2 and on the insulating layer I. Parts of the word lines W that are disposed on the second dielectric D2 act as control gate electrodes KG of the memory transistors S (see FIG. 3). SiO$_2$ is subsequently deposited to a thickness of approximately 600 nm and planarized, thereby producing an intermediate oxide Z having a thickness of approximately 400 nm (see FIG. 3).

Contact holes are opened by masked etching of SiO$_2$ selectively with respect to silicon. Two contact holes are produced per memory cell. The first contact hole (not illustrated) reaches down to the first source/drain region SS1 of the memory transistor S. The second contact hole is produced in such a way that a first part reaches down to the second source/drain region SS2 of the memory transistor S and a second part reaches down to the second source/drain region TS2 of the transfer transistor T (see FIG. 3).

In order to produce first contacts in the first contact holes (not illustrated) and second contacts K in the second contact holes, tungsten is deposited to a thickness of approximately 400 nm and planarized by chemical mechanical polishing until the intermediate oxide Z is uncovered. In order to produce bit lines B and voltage terminal lines L, aluminum is subsequently deposited to a thickness of approximately 400 nm and patterned in strip form by etching. The bit lines B and the lines L have a width of approximately 400 nm. The bit lines B are connected to the first contacts. The lines L are connected to the second contacts K and to a voltage terminal.

Figure 4:
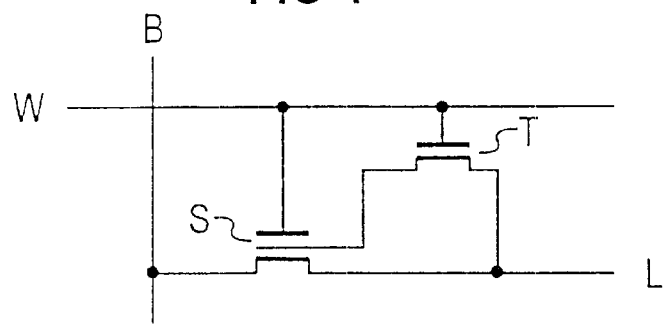
FIG. 4 is a circuit diagram of a memory cell.

FIG. 4 illustrates the circuit diagram of a memory cell of the DRAM cell circuit produced. The memory cell has the memory transistor S and the transfer transistor T. The word line W, the line L and the bit line B are also illustrated.

Figure 5:
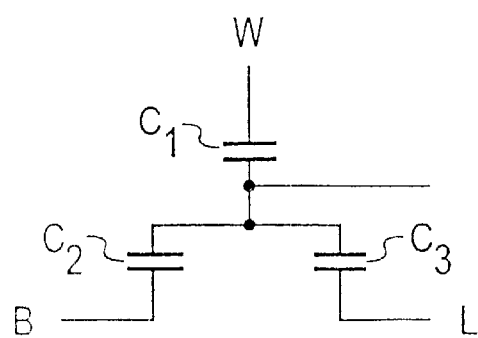
FIG. 5 is an equivalent circuit diagram of the memory transistor.

A method by which the DRAM cell circuit can be operated is now described. FIG. 5 shows an equivalent circuit diagram of the memory transistor S. A capacitance $C_1$ is formed by the control gate electrode KG and by the floating gate electrode. A capacitance $C_2$ is formed by the floating gate electrode and the first source/drain region SS1 of the memory transistor S. A third capacitance $C_3$ is formed by the floating gate electrode and the second source/drain region SS2 of the memory transistor S.

The memory transistor S is produced in such a way that its threshold voltage is $$\frac{11}{16} \times V_{DD}.$$

In this case, VDD is the operating voltage and is equal to 2 volts in the exemplary embodiment.

The transfer transistor T is produced in such a way that its threshold voltage is $$-\frac{3}{16} \times V_{DD}.$$

The memory transistor S is produced in such a way that $C_2=C_3$ and $C_1=2\times C_2$.

The voltage terminal is kept constant at ¼ $V_{DD}$.

In order to write an item of information to the memory cell, the word line W has applied to it a write voltage of zero volts.

In order to write a logic zero, the bit line B has applied to it a bit line voltage of zero volts. It can be calculated that the charge with which the floating gate electrode is thereby charged is $$\frac{3}{16} \times 4C_2 \times V_{DD}.$$

In order to write a logic one, the bit line B has applied to it a bit line voltage of VDD. It can be calculated that the charge with which the floating gate electrode is charged is $$-\frac{1}{16} \times 4C_2 \times V_{DD}.$$

The charge on the floating gate electrode and thus the threshold voltage of the memory transistor S is consequently dependent on the stored information.

It can be calculated that the transfer transistor T is in the on state independently of the voltage on the bit line B.

The memory transistor S is turned off independently of the voltage on the bit line B.

Between the writing and reading of the information, the word line W has applied to it a quiescent voltage of ¾ VDD. It can be calculated that both the memory transistor S and the transfer transistor T are turned off. In this case, the voltage on the bit line B may assume arbitrary values between zero and VDD. When information is read from or written to memory cells which are not connected to the word line W, it is thus the case, in the memory cell considered, that no charge is lost from the floating gate electrode and, moreover, current leading to an undesirable power consumption does not flow.

In order to read out the information of the memory cell, the word line W has applied to it a read voltage of $V_{DD}$. The bit line B has zero volts applied to it.

It can be calculated that the transfer transistor T is in the off state independently of the charge stored on the floating gate electrode.

If a logic zero was stored on the memory cell, then a voltage difference between the floating gate electrode and the first source/drain region of the memory transistor S is $$\frac{12}{16}V_{DD}.$$

Since the threshold voltage of the memory transistor S is lower, the memory transistor S is in the on state in this case.

If a logic one was stored on the memory cell, then the voltage difference between the floating gate electrode and the first source/drain region of the memory transistor S is $$\frac{1}{2} V_{DD}.$$

Since this voltage drop is less than the threshold voltage of the memory transistor, the memory transistor S is in the off state in this case.

There are many conceivable variations of the exemplary embodiment which likewise lie within the scope of the invention. Thus, dimensions of the above-described layers, regions, masks and spacers can be adapted to the respective requirements. The same applies to the choice of materials. The channel region of the memory transistor, the first source/drain region and the second source/drain region of the transfer transistor may also be n-doped instead of p-doped. In this case, the first source/drain region and the second source/drain region of the memory transistor and the channel region of the transfer transistor are p-doped.

We claim:

1. A dynamic random access memory (DRAM) cell circuit, comprising:
    a substrate having a surface;
    a voltage terminal;
    a word line;
    a bit line running transversely to said word line; and
    a plurality of memory cells each containing:
        a memory transistor having a channel region, a control gate electrode, a floating gate electrode, a first source/drain region, and a second source drain region;
        a transfer transistor having a gate electrode, a first source/drain region and a second source/drain region, said word line connected to said gate electrode of said transfer transistor;
        a first dielectric layer disposed between and isolating said floating gate electrode of said memory transistor from said channel region of said memory transistor, and said floating gate electrode connected to said first source/drain region of said transfer transistor;
        a second dielectric layer disposed between and isolating said control gate electrode of said memory transistor from said floating gate electrode of said memory transistor, and said control gate electrode connected to said word line;
        an insulating layer;
        said first source/drain region of said memory transistor connected to said bit line; and
        said second source/drain region of said memory transistor and said second source/drain region of said transfer transistor connected to said voltage terminal;
    said first source/drain region of said memory transistor, said channel region of said memory transistor and said second source/drain region of said memory transistor adjoining said surface of said substrate and are disposed next to one another in said substrate;
    said insulating layer being disposed on said substrate and having a depression formed therein defined by sidewalls and a bottom reaching down to said channel region of said memory transistor;
    said first source/drain region of said transfer transistor being disposed on said first dielectric layer at said bottom of said depression; and
    said second source/drain region of said transfer transistor being disposed on said insulating layer.

2. The DRAM cell circuit according to claim 1, wherein said transfer transistor has a first conductivity type and said memory transistor has a second conductivity type which is opposite to said first conductivity type.

3. The DRAM cell circuit according to claim 2, wherein said transfer transistor is a p-channel transistor and said memory transistor is an n-channel transistor.

4. The DRAM cell circuit according to claim 1, wherein said transfer transistor is a thin-film transistor.

5. The DRAM cell circuit according to claim 1, wherein said control gate electrode of said memory transistor is also said gate electrode of said transfer transistor, and said floating gate electrode is also said first source/drain region of said transfer transistor.

6. The DRAM cell circuit according to claim 5,
    wherein said first dielectric layer covers at least said bottom of said depression;
    including a layer made of polysilicon disposed on said insulating layer and covering said sidewalls of said depression and said first dielectric layer at said bottom of said depression without filling said depression;
    wherein said second source/drain region of said transfer transistor is a part of said layer made of polysilicon;
    wherein said channel region of the transfer transistor is a part of said layer made of polysilicon disposed on said sidewalls of said depression;
    wherein said second dielectric layer is disposed on said layer made of polysilicon; and
    wherein said control gate electrode is disposed on said second dielectric layer.

7. The DRAM cell circuit according to claim 6, wherein said insulating layer has a contact hole formed therein reaching down to said second source/drain region of said memory transistor, and including a contact filling at least said contact hole and overlapping said second source/drain region of said transfer transistor.

* * * * *